United States Patent [19]

Dubelloy

[11] Patent Number: 5,495,889
[45] Date of Patent: Mar. 5, 1996

[54] COOLING DEVICE FOR POWER ELECTRONIC COMPONENTS

[75] Inventor: Jean-Luc Dubelloy, Bron, France

[73] Assignee: GEC Alsthom Transport SA, Paris, France

[21] Appl. No.: 194,015

[22] Filed: Feb. 9, 1994

[30] Foreign Application Priority Data

Feb. 10, 1993 [FR] France .................. 93 01459

[51] Int. Cl.⁶ .................................................. H01L 23/34
[52] U.S. Cl. ..................... 165/104.33; 257/714; 257/717; 257/719; 361/688; 361/689
[58] Field of Search ............................. 257/714, 717, 257/726, 706, 719; 361/688, 689; 165/104.33, 804

[56] References Cited

U.S. PATENT DOCUMENTS

| | | | |
|---|---|---|---|
| 2,915,685 | 12/1959 | Diebold | 257/714 |
| 4,183,042 | 1/1980 | Novak et al. | 257/714 |
| 4,520,383 | 5/1985 | Klein | 257/715 |
| 4,559,580 | 12/1985 | Lutfy | 361/689 |
| 4,672,422 | 6/1987 | Schierz | 257/723 |

FOREIGN PATENT DOCUMENTS 0144579  7/1985  European Pat. Off. .
677293A5 4/1991  Switzerland .

Primary Examiner—Rolf Hille
Assistant Examiner—T. M. Arroyo
Attorney, Agent, or Firm—Sughrue, Mion, Zinn, Macpeak & Seas

[57] ABSTRACT

A cooling device for power electrical components which have electrodes includes a heatsink including a circuit in which a cooling fluid can flow and having a first side for exchange of heat with the component to be cooled. An electrically insulative and good heat conductor material plate is disposed between the first side of the heatsink and a first side of an electrical connection. A second side of this electrical connection makes thermal and electrical contact with one electrode of a component. The heatsink and the electrical connection are mechanically joined so that the device forms a compact assembly.

7 Claims, 2 Drawing Sheets

COOLING DEVICE FOR POWER ELECTRONIC COMPONENTS

BACKGROUND OF THE INVENTION

1. Field of the Invention

The present invention concerns a cooling device for power electronic components with particular application to semiconductor components.

2. Description of the Prior Art

It is standard practise to cool high-voltage and power electronic components using a coolant fluid. Various methods have been proposed.

The coolant fluid may be water, which has the advantages of being inexpensive and non-pollutant. In this case electrical insulation must be provided between the cooling water and the conductive parts of the component to be cooled. Document DE 4 017 749 discloses a cooling device for semiconductor components whose electrical contacts are in the form of two opposed parallel surfaces. The components are designed to be stacked and there are piled up in succession a first electrical connection, a first component, a second electrical connection, an electrically insulated body which is a good heat conductor and in which the water flows, a further first electrical connection, and so on. This device is particularly bulky. Also the electrically insulative and good heat conductor materials are less efficient in terms of heat exchange than a metal which is a good electrical conductor, such as copper.

Also known are direct cooling devices in which a heat and electrical conductor body is disposed directly on the electrical connection. The conductive body is connected to insulative tubes through which a dielectric cooling fluid is caused to flow in the body. The dielectric fluid may be oil or de-ionized water if an inexpensive non-polluting fluid is preferred. Oil has poor thermal performance in any event. As for de-ionized water, it requires a bulky and costly treatment system.

Another solution is to effect cooling by interposition of encapsulated insulative plates. In the case of superposed semiconductor components of the type mentioned above, the stacking is effected as follows: component, electrical connection, first copper weight, electrically insulative and heat conducting plate, second copper weight, metal cooling body in which flows a fluid such as water, and then the same components in reverse order: the two weights separated by the insulative plate, the electrical connection and the component. To increase the length of the electric field lines it is necessary to encapsulate the insulative plate between the two adjacent weights. This solution results in a very bulky device.

These various prior art solutions thus all have drawbacks that the present invention can remove. To this end the invention proposes a device integrating into a single system at least one electrical connection, one insulative plate per connection and a metal cooling body using non-de-ionized water.

SUMMARY OF THE INVENTION

The invention consists in a cooling device for power electrical components having electrodes, the device comprising a heatsink including a circuit in which a cooling fluid can flow and a first side for exchange of heat with the component to be cooled, an electrically insulative and good heat conductor material plate between said first side of said heatsink and a first side of an electrical connection whose second side is adapted to make thermal and electrical contact with one electrode of a component, and means mechanically joining said heatsink and said electrical connection so that the device forms a compact assembly.

The mechanical joining means may comprise an electrical insulator disposed between said connection and the heatsink, fixed to the connection and to the heatsink and delimiting an area between the heatsink and the connection protected from pollution.

The mechanical coupling may be provided by resin filling said protected area.

It may be provided by a foil connecting the heatsink to the insulator and by fixing the insulator to said connection.

Having only one heat exchange side, the heatsink may be in two parts, a first part of which one side constitutes said heat exchange side and whose other side includes a groove in which the cooling fluid flows, and a second part of which one side covers the second side of the first part, this second part having cooling fluid inlet and outlet orifices, a cooling fluid inlet pipe leading from the inlet orifice to the inlet of said groove and a cooling fluid outlet pipe leading from the outlet of said groove to the outlet orifice.

The heatsink having two heat exchange sides corresponding to two components to be cooled may be in three parts, a first part of which a first side constitutes one of said heatsink sides and of which a second side includes a first groove in which cooling fluid flows, a second part one side of which constitutes the other heat exchange side and a second side of which includes a second groove in which cooling fluid flows and a third part of which one side covers the second side of the first part and the other side covers the second side of the second part, this third part having cooling fluid inlet and outlet orifices, a cooling fluid inlet pipe leading from the inlet orifice to the inlet of the first groove, a fluid pipe between the outlet of the first groove and the inlet of the second groove, and a fluid outlet pipe leading from the outlet of the second groove to the outlet orifice.

The cooling fluid circuit may have a spiral shape on one or each heat exchange side.

The invention will be more clearly understood and other advantages and features of the invention will emerge from the following description given by way of non-limiting example with reference to the accompanying drawings.

DETAILED DESCRIPTION OF THE PREFERRED EMBODIMENTS

Figure 1:
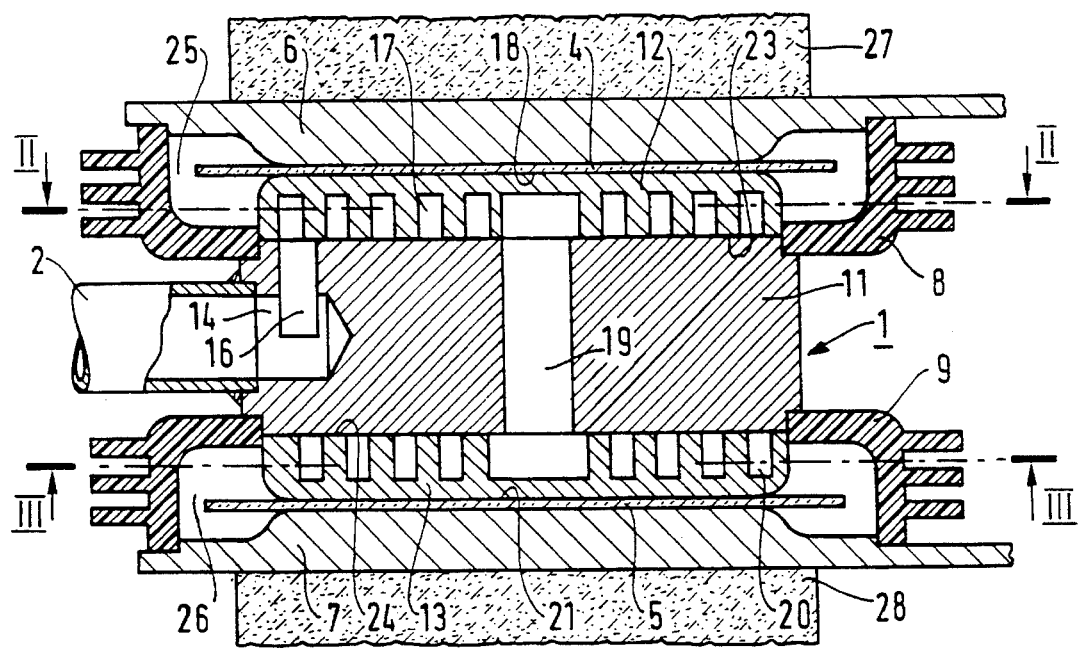
FIG. 1 is a cross-section view of a cooling device in accordance with the invention for cooling two

The device shown in FIG. 1 has two opposed heat exchange sides. It comprises a heatsink 1 in three parts: a central body 11, a first heat exchange part 12 and a second heat exchange part 13. A cooling fluid flows in the heatsink and is fed to it by a pipe 2 leading to an inlet orifice 14 of the heatsink and evacuated through a pipe 3 leading to an outlet orifice 15 (see FIGS. 2 and 3).

The cooling circuit comprises, from the inlet orifice 14 to the outlet orifice 15: a pipe 16 connecting the inlet orifice 14 to channels 17 in the immediate vicinity of the heat exchange side 18, a pipe 19 connecting the channels 17 to the channels 20 in the immediate vicinity of the heat exchange side 21, and a pipe 22 (see FIG. 3) connecting the channels 20 to the outlet orifice 15.

Figure 2:
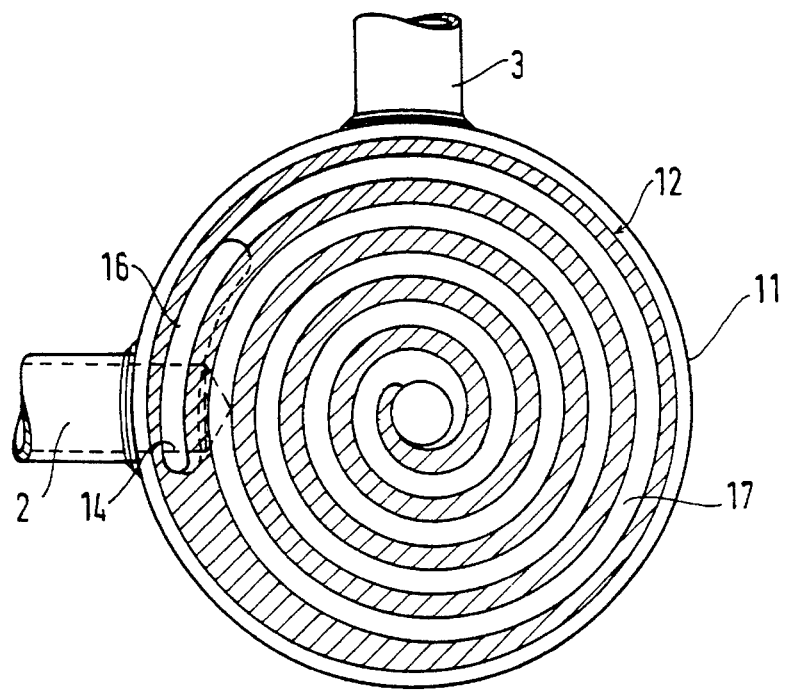
FIG. 2 is a cross-section view of the heatsink of the cooling device on the line II—II in FIG. 1.
Figure 3:
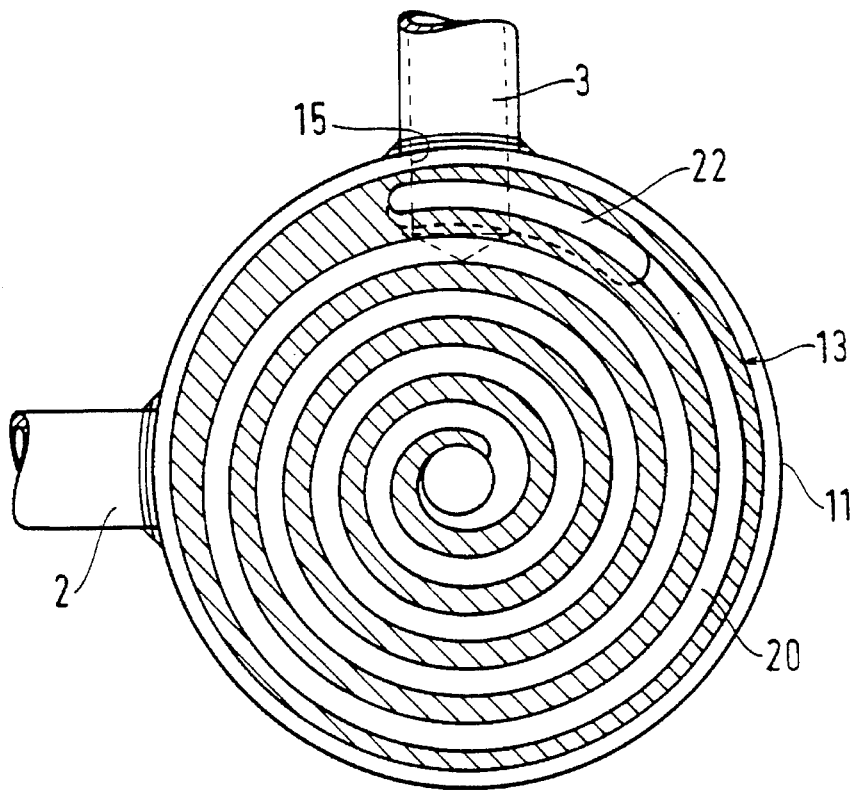
FIG. 3 is a cross-section view of the heatsink of the cooling device on the line III—III in FIG. 1.

In the example shown the channels 17 and 20 are spiral shaped as clearly seen in FIGS. 2 and 3. These channels are advantageously made in the following manner. Spiral grooves are machined into the sides 23 and 24 of the parts 12 and 13, these sides being opposite the heat exchange sides 18 and 21, respectively. When the three parts 11, 12 and 13 are superposed as shown in FIG. 1, the grooves are covered and the cooling fluid can flow only within the spiral.

The parts 12 and 13 are made from the same metal which is a good conductor of heat, such as copper. The part 11 may also be made from copper. They may advantageously be assembled together by brazing the parts 12 and 13 to the part 11.

The pipes 2 and 3 may be brazed or screwed to the block 11.

To effect a good transfer of cooling fluid at the inlet of the channels 17 or at the outlet of the channels 20 it is advantageous for the pipes 16 and 22 to have an elongate shape matching the spiral shape of the grooves.

The cooling device further comprises plates 4 and 5 respectively bearing on the heat exchange sides 18 and 21. These plates 4 and 5 are made from a material which is a good electrical insulator and a good thermal conductor such as a ceramic material, for example.

The plates 4 and 5 respectively support the electrical connections 6 and 7 which are made from copper, for example. Each insulative plate has large common surfaces with its respective heat exchange and electrical connection parts to facilitate the transmission of heat generated by the electrical components. The electrical connections 6 and 7 also have large contact surfaces, both electrical and thermal, with the components 27 and 28.

The shapes of the electrical connections, the insulative plates and the heat exchange parts can alleviate the effects of electric fields. Thus on departing from the surface they share with an insulative plate, the electrical connection and the heat exchange part are of rounded shape to limit the electric field. For the same reason the insulative plates extend to a sufficient distance beyond the heat exchange sides.

The device finally comprises insulators 8 and 9 made from a polymer material, for example, and respectively corresponding to the heat exchange sides 18 and 21. These insulators protect annular areas 25, 26 which are particularly sensitive to pollution from the electrical point of view. These areas may be filled with clean air or with a dielectric material such as a gel or a resin.

The protected areas 25 and 26 must be well sealed. By filling these areas with resin a compact assembly is obtained combining the heatsink 1, the insulative plates 4 and 5 and the electrical connections 6 and 7. This assembly may advantageously be assembled by assembling the various components of the device with a clamping force as required by the semiconductors (3.5 tonnes, for example, for a 75 mm diameter component). The resin is then injected through orifices provided in the insulators 8 and 9. When the resin has polymerized the device forms a unit ready to be used in a stack of semiconductors.

Note that the electrical connections 6 and 7 can be oriented identically or offset. In some cases these connections may be electrically interconnected.

An important advantage of the present invention is the reduced distance between two electrical components to be cooled. In the prior art as described above (encapsulated insulative plate interposed between connection and cooling body), for semiconductors operating at a voltage of 4.5 kV it is common to have a distance of 80 mm between two successive components in a stack, for a rated power of 1 500 W. Under the same conditions (26 mm thick semiconductors, operating at 4.5 kV), the device in accordance with the invention may have a thickness of only 50 mm and can dissipate 2 200 W.

Figure 4:
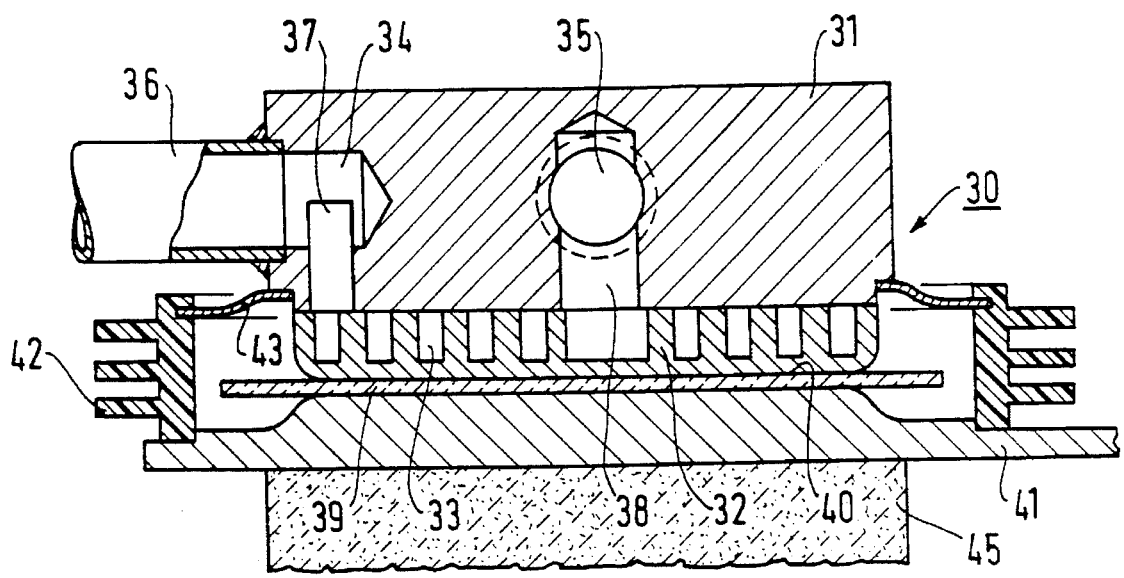
FIG. 4 is a cross-section view of a cooling device in accordance with the invention for cooling a single power electronic component.

The device shown in FIG. 4 can be used to cool a single component, for example the component 45 at the end of a stack of components. It comprises a heatsink 30 in two parts: a body 31 and a heat exchange part 32 brazed to the body 30. A groove 33 is machined into the part 32 to constitute the cooling channels. As previously it has a spiral shape.

A body 31 comprises a cooling fluid inlet orifice 34 and an outlet orifice 35 for this fluid. These orifices receive pipes which feed and evacuate the fluid. Only the feed pipe 36 can be seen in FIG. 4. A pipe 37 connects the inlet orifice 34 to the inlet of the groove 33. A pipe 38 connects the outlet of the groove 33 to the outlet orifice 35.

A plate 39 made from a ceramic material, for example, is disposed between the heat exchange side 40 of the part 32 and the electrical connection 41.

The device also includes an insulator 42 protecting the area electrically sensitive to pollution. The device may be mechanically assembled by fixing the insulator 42 to the electrical connection 41 (using an adhesive, for example) and an annular foil 43 having one edge embedded in the insulator 42 and the other edge brazed to the body 31.

Another way to assemble the device is to braze the plate 39 to the part 32 and to the electrical connection 41. In this case the ceramic plate 39 is metal-plated on its major surfaces to enable brazing.

The advantages of the invention include the use of water as the cooling fluid, possibly containing an antifreeze such as glycol, and the absence of any cooling fluid filter system. The insulative plates can be protected against external pollution. Another advantage is the total integration of the electrical connection, the heatsink and the electrical insulation into a single assembly.

There is claimed:

1. Cooling device for power electrical components having electrodes, the device comprising a heatsink including a circuit for carrying a flow of cooling fluid and at least one first side for exchange of heat with the component to be cooled, an electrically insulative and heat conductor material plate disposed between said at least one first side of said heatsink and a first side of an electrical connection so as to provide electrical independence between said heatsink and said components, said electrical connection having a second side adapted to make thermal and electrical contact with one electrode of a component, and means mechanically joining said heatsink and said electrical connection, said means mechanically joining being electrically insulative, wherein the device forms a compact assembly.

2. Device according to claim 1 wherein the means mechanically joining comprise an electrical insulator disposed between said connection and said heatsink, said insulator being fixed to said connection and to said heatsink and delimiting between said heatsink and said connection an area protected from pollution.

3. Device according to claim 2 wherein said means mechanically joining further comprises resin filling said protected area.

4. Device according to claim 2 wherein said means mechanically joining further comprises a foil joining said heatsink to said insulator.

5. Device according to claim 1 wherein said heatsink has only one heat exchange said, said heatsink having a first part having a first side constituting said heat exchange side and a second side including said circuit for carrying a flow of cooling fluid, said circuit comprising a groove, and a second part having one side covering the second side of the first part, said second part having cooling fluid inlet and outlet orifices, a fluid inlet pipe leading from said inlet orifice to an inlet of said groove and a fluid outlet pipe leading from an outlet of said groove to said outlet orifice.

6. Device according to claim 1 wherein said heatsink has two heat exchange sides for cooling two components, said heatsink having a first part having a first side being a first one of said heat exchange sides and a second side including said circuit for carrying a flow of cooling fluid, said circuit comprising a first groove; a second part having a first side being a second one of said heat exchange sides and a second side including said circuit for carrying a flow of cooling fluid, said circuit further comprising a second groove; and a third part having one side covering the second side of said first part and another side covering the second side of said second part, said third part having cooling fluid inlet and outlet orifices, a cooling fluid inlet pipe leading from said inlet orifice to an inlet of said first groove, a fluid pipe disposed between an outlet of said first groove and an inlet of said second groove, and a cooling fluid outlet pipe leading from an outlet of said second groove to said outlet orifice.

7. Device according to claim 1 wherein the circuit for carrying a flow of cooling fluid is spiral in shape.

* * * * *